(12) United States Patent
Nishi

(10) Patent No.: US 6,270,174 B1
(45) Date of Patent: Aug. 7, 2001

(54) CASE FOR ELECTRONIC EQUIPMENT

(75) Inventor: Takayoshi Nishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/471,405

(22) Filed: Dec. 23, 1999

(30) Foreign Application Priority Data

Jul. 5, 1999 (JP) .................................................. 11-190118

(51) Int. Cl.[7] .................................................. A47B 97/00
(52) U.S. Cl. ..................... 312/223.1; 312/332.1
(58) Field of Search ............................. 312/223.1, 223.2, 312/330.1, 332.1, 348.1, 9.11, 9.29, 9.32, 9.47, 9.53, 9.56; 361/683, 685, 725, 726, 727

(56) References Cited

U.S. PATENT DOCUMENTS 5,797,667 * 8/1998 Wu ...................................... 312/332.1
6,008,984 * 12/1999 Cunningham et al. ....... 312/332.1 X
6,058,016 * 5/2000 Anderson et al. .................... 361/727
6,067,225 * 5/2000 Reznikov et al. ............ 312/223.2 X

* cited by examiner

Primary Examiner—James O. Hansen
(74) Attorney, Agent, or Firm—Armstrong, Westerman, Hattori, McLeland & Naughton, LLP

(57) ABSTRACT

A case for electronic equipment including a main frame having an upper wall and a lower wall, an upper fit plate slidably mounted on the upper wall, and a lower fit plate slidably mounted on the lower wall. The upper wall is formed with a plurality of equally spaced ridges, and the upper fit plate is formed with a plurality of equally spaced ridges arranged with the same pitch as that of the ridges of the upper wall. Similarly, the lower wall is formed with a plurality of equally spaced ridges, and the lower fit plate is formed with a plurality of equally spaced ridges arranged with the same pitch as that of the ridges of the lower wall. The case further includes a first fit lever pivotably mounted to the main frame so as to be operatively connected to the upper fit plate, and a second fit lever pivotably mounted to the main frame so as to be operatively connected to the lower fit plate. The first fit lever and the second fit lever are pivotably and slidably connected with each other.

7 Claims, 9 Drawing Sheets

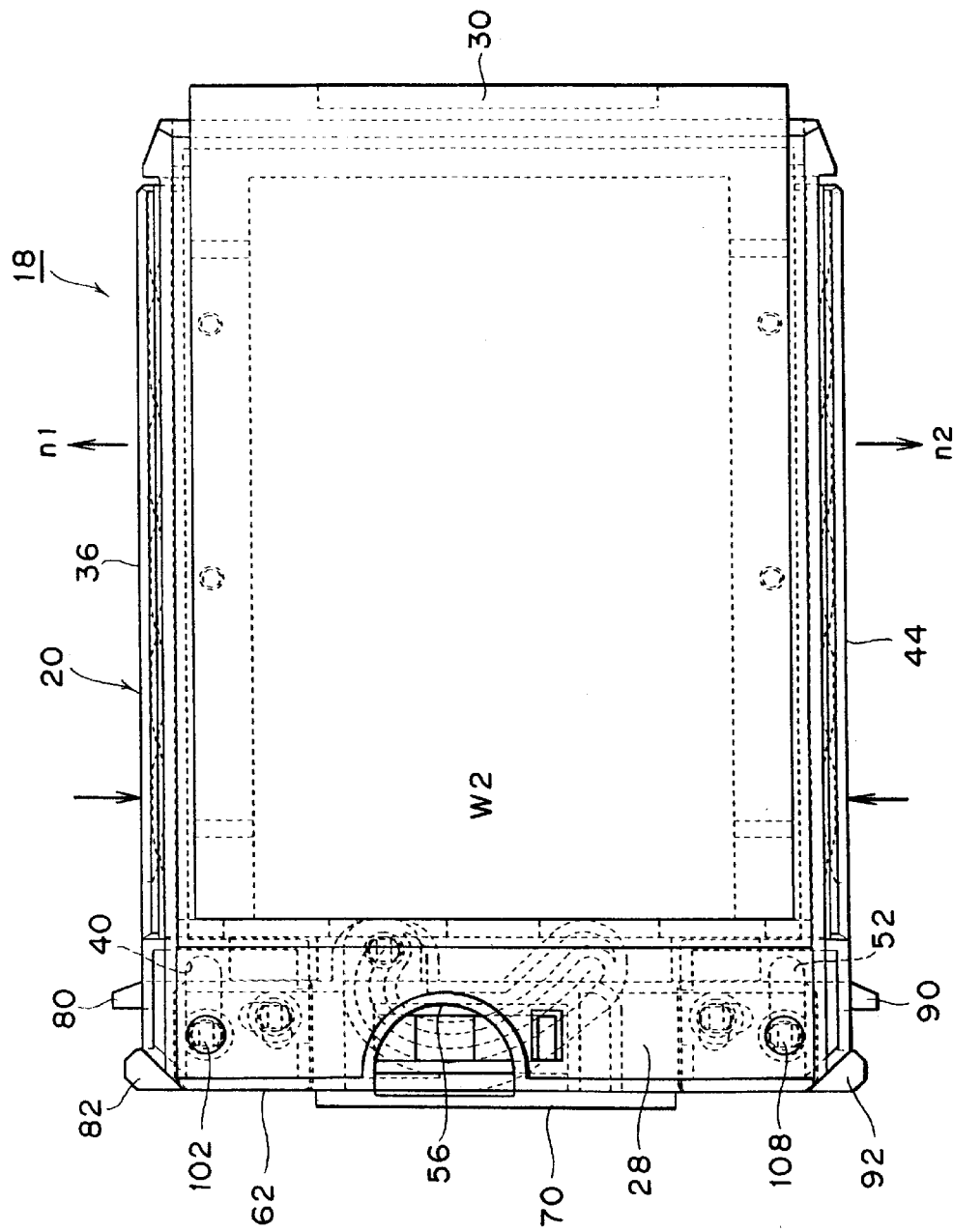

CASE FOR ELECTRONIC EQUIPMENT

BACKGROUND OF THE INVENTION

1. Field of the Invention

The present invention relates generally to a case for accommodating electronic equipment, and more particularly to a case for accommodating a hard disk drive (HDD) adapted to be removably mounted in a computer such as a server or a workstation.

2. Description of the Related Art

In recent years, it has been desired to reduce the size of an HDD as a kind of external storage device for a computer and also to increase the capacity of the HDD. A method for increasing the capacity of the HDD is to increase the number of magnetic disks to be mounted on a spindle. In a recent HDD, the spacing between disks to be mounted has been reduced with the increase in the number of disks. It is expected that a future HDD will have a higher capacity and a higher speed, so that there is a possibility that when a head mounted in a disk drive, tracing a certain track on a disk is minutely vibrated, the head may encroach on the adjacent tracks on the disk to cause off-track trouble such as data misreading or data garbling. This off-track trouble is also caused by vibrations of a spindle motor and other components mounted in the disk drive.

A host computer such as a server or a workstation is connected through a communication network such as a local area network (LAN) to many subordinate computers, and adopts a so-called active disk drive unit which can be easily inserted into and removed from a shelf for accommodating the disk drive unit in the condition where the power to the host computer is on. The active disk drive unit is composed of a disk drive such as a hard disk drive and a case for accommodating the disk drive therein. The active disk drive unit is inserted into or removed from the shelf accommodated in the host computer as required without powering off the host computer.

A conventional case for an active disk drive is formed of integrally molded plastic, and has a plurality of resilient portions. In the condition where the case accommodating the active disk drive is inserted in the shelf, the resilient portions of the case abut against guide rails formed on the inner surface of the shelf to thereby absorb the vibrations by utilizing a spring action of plastic. However, in such a conventional vibration absorbing method utilizing a spring action of plastic, the play of the active disk drive unit with respect to the guide rails of the shelf cannot be completely absorbed, and this play may amplify the vibrations of the head due to the vibrations of the spindle motor or a cooling fan in the computer. As a result, the head off-track trouble cannot be eliminated.

SUMMARY OF THE INVENTION

It is therefore an object of the present invention to provide a case for electronic equipment which can completely absorb the play of an active electronic equipment unit with respect to the guide rails of the shelf.

In accordance with an aspect of the present invention, there is provided a case for electronic equipment, comprising a main frame for accommodating the electronic equipment so that the electronic equipment is removably fitted within the main frame, the main frame including a first surface having a first pressure portion, a second surface having a second pressure portion, and a plate connecting the first surface and the second surface; a first fit plate slidably mounted on the first surface, the first fit plate having a third pressure portion; a second fit plate slidably mounted on the second surface, the second surface having a fourth pressure portion; a first fit lever pivotably mounted to the plate so as to be operatively connected to the first fit plate; and a second fit lever having a first end portion pivotably mounted to the plate so as to be operatively connected to the second fit plate and a second end portion pivotably and slidably connected to the first fit lever; the first and second fit levers being movable between a first position where the third and fourth pressure portions of the first and second fit plates are separated from the first and second pressure portions of the first and second surfaces, respectively, and a second position where the third and fourth pressure portions of the first and second fit plates are brought into pressure contact with the first and second pressure portions of the first and second surfaces, respectively, by sliding the first and second fit plates.

Preferably, the first pressure portion of the first surface comprises a plurality of first pressure portions spaced at equal intervals, and the third pressure portion of the first fit plate comprises a plurality of third pressure portions spaced at equal intervals with the same pitch as that of the first pressure portions. Similarly, the second pressure portion of the second surface comprises a plurality of second pressure portions spaced at equal intervals, and the fourth pressure portion of the second fit plate comprises a plurality of fourth pressure portions spaced at equal intervals with the same pitch as that of the second pressure portions. The plate is composed of a first plate and a second plate opposed to each other, wherein when the first and second fit levers are moved to the second position, the first and second fit levers are received between the first and second plates.

The electronic equipment is accommodated in the case to provide an electronic equipment unit. The electronic equipment unit is inserted into or removed from a shelf mounted in a computer. The shelf has a plurality of guide rails for guiding insertion and removal of the electronic equipment unit with respect to the shelf. When the electronic equipment unit is fully inserted into the shelf, the first and second fit levers are moved to the second position. In concert with this movement, the first and second fit plates are slid to make pressure contact of the pressure portions of the first fit plate and the first surface and pressure contact of the pressure portions of the second fit plate and the second surface. As a result, the first and second fit plates are moved away from the first and second surfaces, respectively, thereby increasing the distance between the first and second fit plates to forcibly press the first and second fit plates on the inner surface of the shelf. Accordingly, the play of the electronic equipment unit with respect to the shelf can be completely eliminated.

In removing the electronic equipment unit from the shelf, the first and second fit levers are moved to the first position, so that the pressure portions of the first and second fit plates are separated from the pressure portions of the first and second surfaces, respectively. As a result, the distance between the first and second fit plates is reduced to thereby allow easy removal of the electronic equipment unit from the shelf.

In accordance with another aspect of the present invention, there is provided a case for electronic equipment, comprising a main frame for accommodating the electronic equipment so that the electronic equipment is removably fitted within the main frame, the main frame including a first surface, a second surface having a first pressure portion, and a plate connecting the first surface and the second surface;

a fit plate slidably mounted on the second surface, the fit plate having a second pressure portion; and a fit lever pivotably mounted to the plate so as to be operatively connected to the fit plate; the fit lever being movable between a first position where the second pressure portion of the fit plate is separated from the first pressure portion of the second surface and a second position where the second pressure portion of the fit plate is brought into pressure contact with the first pressure portion of the second surface by sliding the fit plate.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7 is a side view of the active disk drive unit in the condition where the first and second fit levers are retracted in the main frame;

DETAILED DESCRIPTION OF THE PREFERRED EMBODIMENTS

Figure 1:
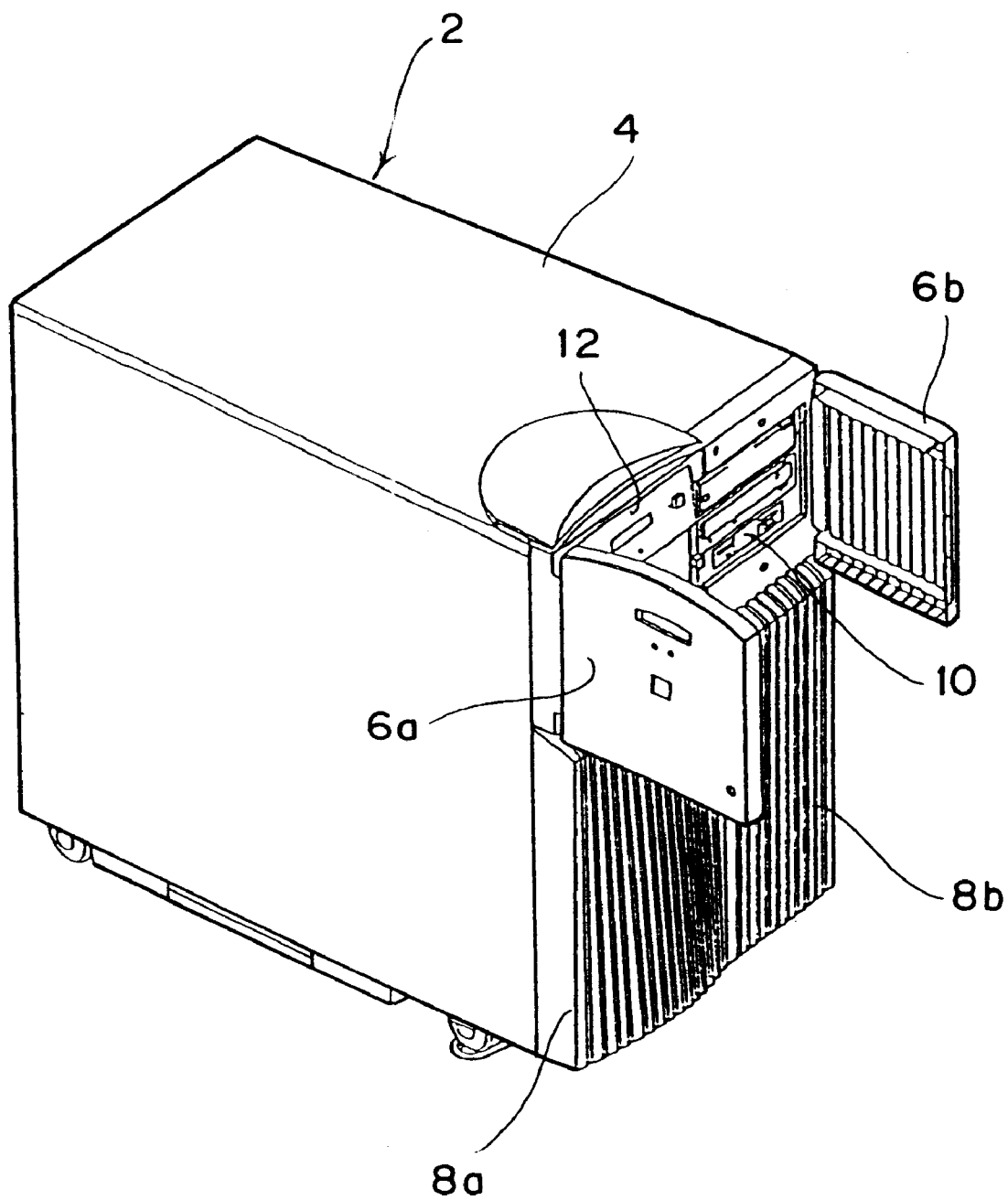
FIG. 1 is a perspective view of a server to which the present invention is applicable.

Referring to FIG. 1, there is shown a perspective view of a server 2 in which an active disk drive unit according to the present invention is mounted. The server 2 has a main frame 4 on which a pair of panel covers 6a and 6b and a pair of front covers 8a and 8b are mounted. Reference numeral 10 denotes a floppy disk drive, and reference numeral 12 denotes an operation panel.

Figure 2:
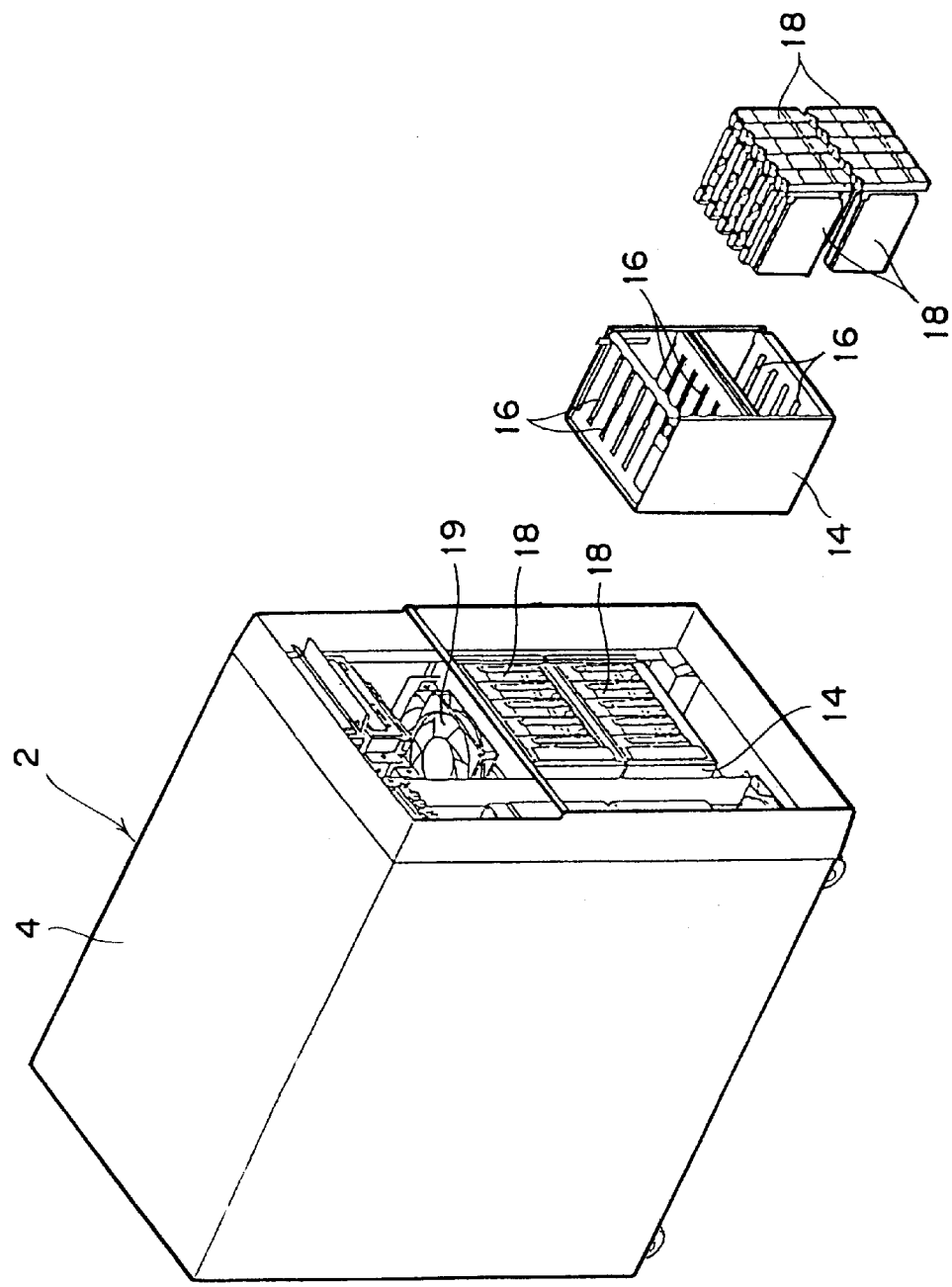
FIG. 2 is a perspective view of the server in the condition where covers and the like are removed to illustrate a mounting method for active disk drive units.

FIG. 2 is a perspective view of the server 2 in the condition where the panel covers 6a and 6b, the front covers 8a and 8b, the floppy disk drive 10, and the operation panel 12 are removed to illustrate a mounting method for a plurality of active disk drive units 18. Reference numeral 14 denotes a shelf having a plurality of guide rails 16 for guiding the active disk drive units 18 to be inserted into the shelf 14.

In actual, the shelf 14 is accommodated in the main frame 4 of the server 2. After opening the front covers 8a and 8b, the active disk drive units 18 are inserted into the shelf 14 or removed from the shelf 14. Reference numeral 19 denotes a cooling fan. The server 2 is connected through a communication network such as a local area network (LAN) (not shown) to a plurality of subordinate computers or the like, so that insertion and removal of each active disk drive unit 18 with respect to the shelf 14 is carried out with the power to the server 2 being kept on.

Figure 3:
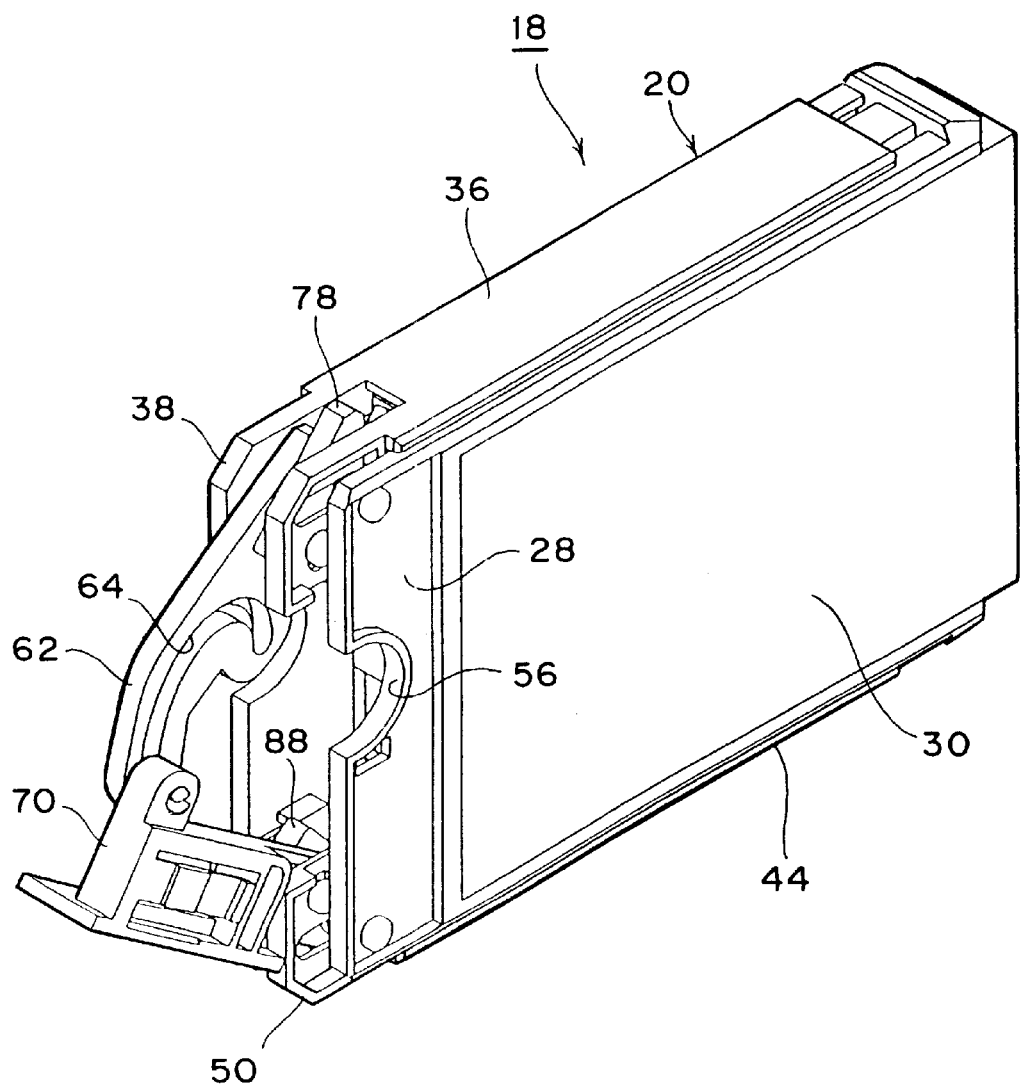
FIG. 3 is a perspective view of each active disk drive unit employing a disk drive case according to a first preferred embodiment of the present invention.
Figure 4:
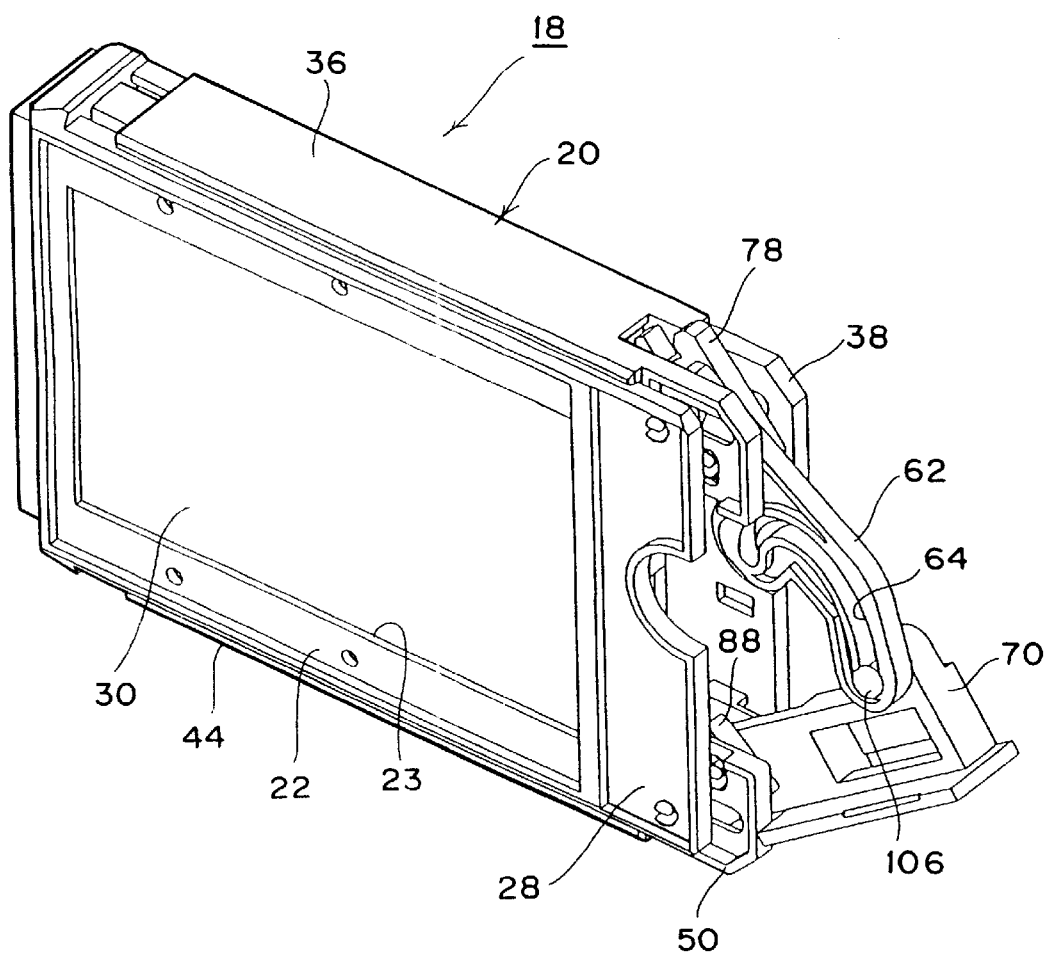
FIG. 4 is a perspective view of the active disk drive unit shown in FIG. 3 as viewed from the opposite side.
Figure 5:
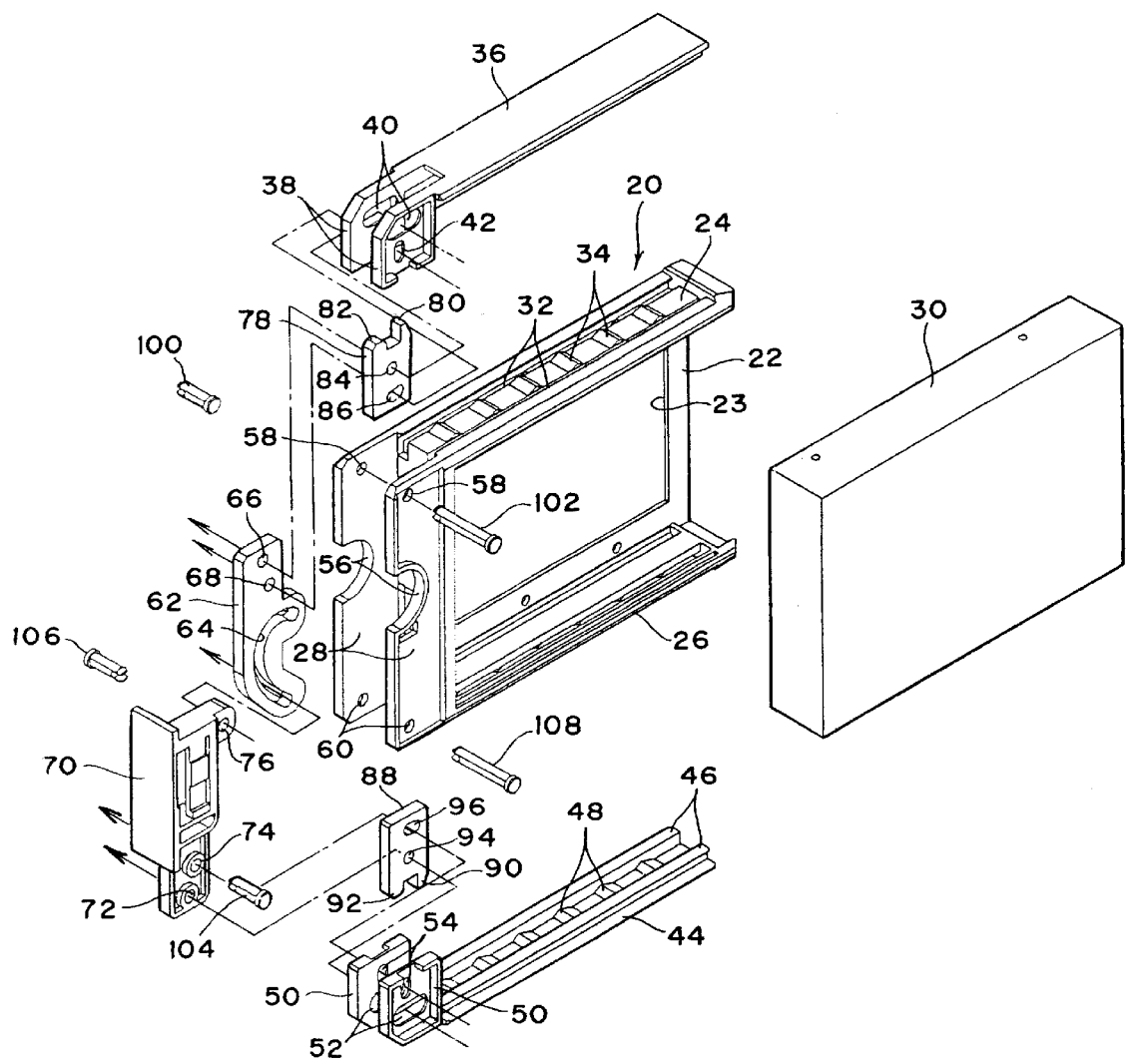
FIG. 5 is an exploded perspective view of the case according to the first preferred embodiment of the present invention.

Referring to FIG. 3, there is shown a perspective view of each active disk drive unit 18 according to a first preferred embodiment of the present invention. FIG. 4 is a perspective view of the active disk drive unit 18 shown in FIG. 3 as viewed from the opposite side. FIG. 5 is an exploded perspective view of the active disk drive unit 18 shown in FIG. 3. The active disk drive unit 18 is composed generally of a case 20 and a hard disk drive (HDD) 30 accommodated in the case 20. Referring mainly to FIG. 5, the case 20 includes a main frame 22 formed of molded resin.

The main frame 22 has an opening 23, an upper wall 24, a lower wall 26, and a pair of opposed front plates 28 connecting the upper wall 24 and the lower wall 26. The HDD 30 is snugly fitted within the main frame 22 without play. The upper wall 24 has an upper surface formed with a pair of guide grooves 32 and a plurality of ridges 34 spaced at equal intervals. Similarly, although especially not shown, the lower wall 26 has a lower surface formed with a pair of guide grooves and a plurality of ridges spaced at equal intervals.

The case 20 further includes an upper fit plate 36 formed of molded resin. The upper fit plate 36 has a pair of opposed mounting portions 38 at a front end portion. Each mounting portion 38 is formed with an elongated hole 40 extending in the longitudinal direction of the upper fit plate 36 and an elongated hole 42 extending in a direction perpendicular to the direction of extension of the elongated hole 40. Although not shown, the upper fit plate 36 has a lower surface formed with a pair of guide rails engaged with the guide grooves 32 of the upper wall 24 and a plurality of ridges spaced at equal intervals with the same pitch as that of the ridges 34 of the upper wall 24.

The case 20 further includes a lower fit plate 44 formed of molded resin. The lower fit plate 44 has the same shape as that of the upper fit plate 36. The lower fit plate 44 has an upper surface formed with a pair of guide rails 46 engaged with a pair of guide grooves of the lower wall 26 and a plurality of ridges 48 spaced at equal intervals with the same pitch as that of the ridges of the lower wall 26. The lower fit plate 44 has a pair of opposed mounting portions 50 at a front end portion. Each mounting portion 50 is formed with an elongated hole 52 extending in the longitudinal direction of the lower fit plate 44 and an elongated hole 54 extending in a direction perpendicular to the direction of extension of the elongated hole 52. Each front plate 28 of the main frame 22 is formed at its substantially central portion with a substantially semicircular recess 56 for allowing insertion of an operator's finger. Each front plate 28 is further formed at its upper and lower end portions with holes 58 and 60, respectively.

The case 20 further includes a first fit lever 62 formed of molded resin. The first fit lever 62 has a substantially C-shaped slot 64 and two holes 66 and 68. The case 20 further includes a second fit lever 70 formed of molded resin. The second fit lever 70 has two holes 72 and 74 at a lower end portion and one hole 76 at an upper end portion.

The case 20 further includes two blocks 78 and 88 formed of molded resin and having the same shape. The block 78 has two projections 80 and 82, a hole 84, and an elongated hole 86. Similarly, the block 88 has two projections 90 and 92, a hole 94, and an elongated hole 96.

The case 20 is assembled in the following manner. The first fit lever 62 and the block 78 are inserted between the mounting portions 38 of the upper fit plate 36, and a pin 100 is inserted through the elongated holes 42 of the mounting portions 38 of the upper fit plate 36, the hole 68 of the first fit lever 62, and the elongated hole 86 of the block 78. In this condition, the first fit lever 62 and the block 78 are pivotably mounted to the mounting portions 38 of the upper fit plate 36 by the pin 100. Then, the guide rails of the upper fit plate 36 are slidingly inserted into the guide grooves 32 of the upper wall 24 of the main frame 22, and a pin 102 is inserted through the holes 58 of the main frame 22, the elongated holes 40 of the upper fit plate 36, the hole 66 of the first fit lever 62, and the hole 84 of the block 78. In this condition, the upper fit plate 36, the first fit lever 62, and the block 78 are mounted to the main frame 22 by the pin 102 so that the upper fit plate 36 is slidable with respect to the main frame 22.

Similarly, the second fit lever 70 and the block 88 are inserted between the mounting portions 50 of the lower fit plate 44, and a pin 104 is inserted through the elongated holes 54 of the mounting portions 50 of the lower fit plate 44, the hole 74 of the second fit lever 70, and the elongated hole 96 of the block 88. In this condition, the second fit lever 70 and the block 88 are pivotably mounted to the mounting portions 50 of the lower fit plate 44 by the pin 104. Then, the guide rails 46 of the lower fit plate 44 are slidingly inserted into the guide grooves of the lower wall 26 of the main frame 22, and a pin 108 is inserted through the holes 60 of the main frame 22, the elongated holes 52 of the lower fit plate 44, the hole 72 of the second fit lever 70, and the hole 94 of the block 88.

In this condition, the lower fit plate 44, the second fit lever 70, and the block 88 are mounted to the main frame 22 by the pin 108 so that the lower fit plate 44 is slidable with respect to the main frame 22. Finally, a pin 106 is inserted through the slot 64 of the first fit lever 62 and the hole 76 of the second fit lever 70 to thereby relatively movably link the first fit lever 62 and the second fit lever 70, thus assembling the case 20. Further, the HDD 30 is inserted into the case 20. In this condition, the HDD 30 is snugly fitted within the main frame 22 of the case 20 without play, thus obtaining the disk drive unit 18 as shown in FIGS. 3 and 4.

Figure 6:
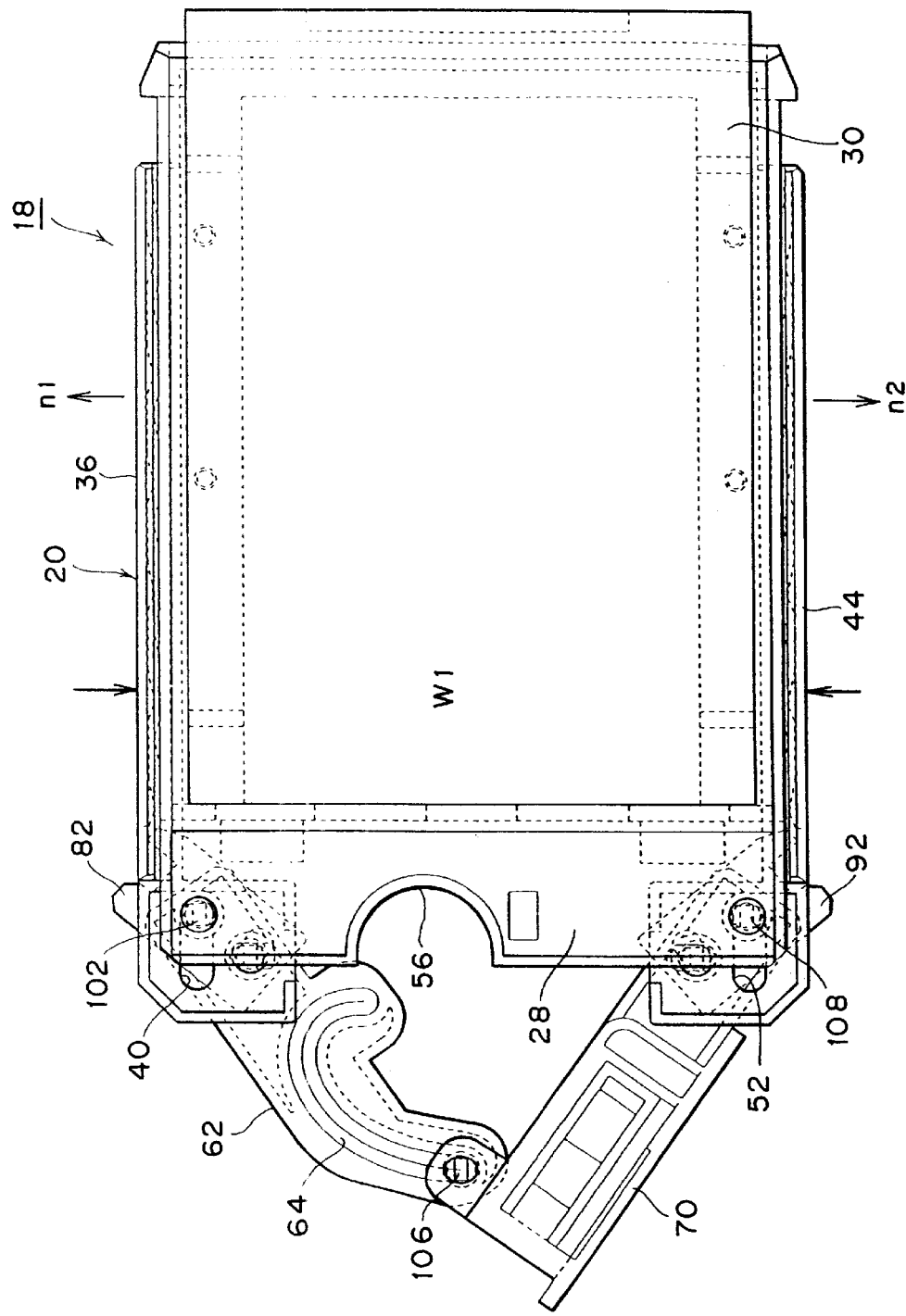
FIG. 6 is a side view of the active disk drive unit in the condition where first and second fit levers are projected from a main frame.
Figure 8A:
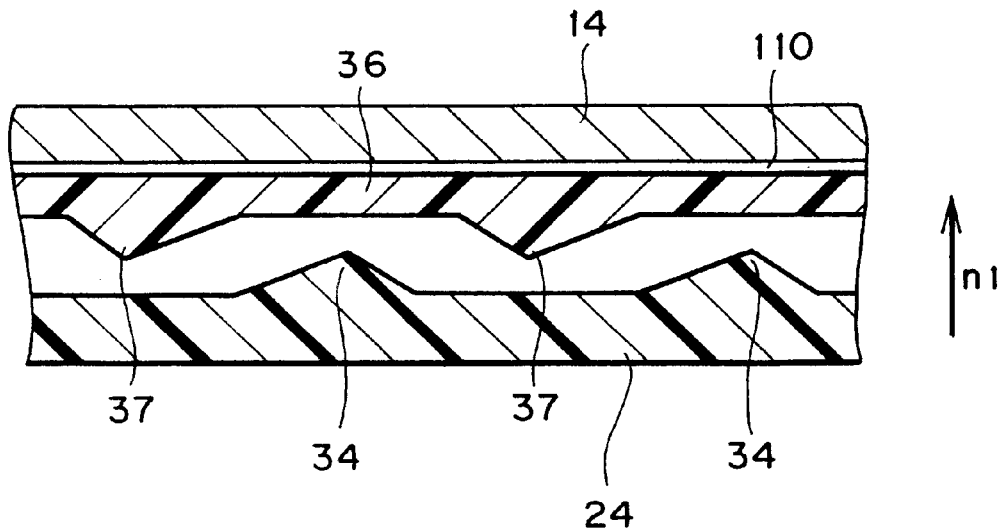
FIG. 8A is a sectional view for illustrating a positional relation between an upper wall and an upper fit plate of the case in the projected condition of the fit levers.
Figure 8B:
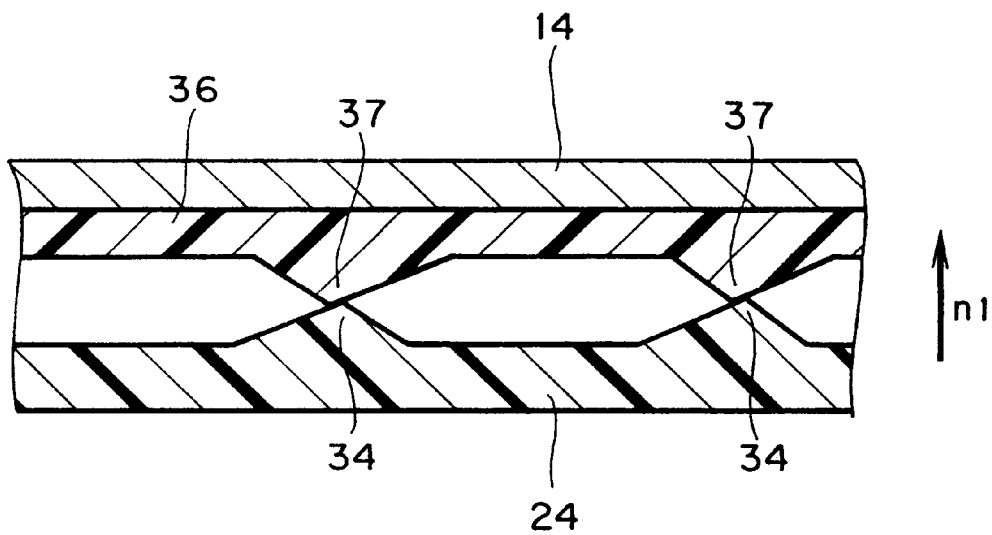
FIG. 8B is a sectional view for illustrating a positional relation between the upper wall and the upper fit plate in the retracted condition of the fit levers.

Referring to FIG. 6, there is shown a side view of the disk drive unit 18 in the condition where the first and second fit levers 64 and 70 are projected from the front plates 28 of the main frame 22. In this condition, the disk drive unit 18 is inserted into the shelf 14 along the guide rails 16 thereof. When the disk drive unit 18 is inserted in the shelf 14 in the projected condition of the first and second fit levers 64 and 70 shown in FIG. 6, each ridge 37 of the upper fit plate 36 is spaced from and interposed between two adjacent ones of the ridges 34 of the upper wall 24 of the main frame 22 as shown in FIG. 8A, and there is defined a spacing 110 of about 0.5 mm between the upper fit plate 36 and the shelf 14. Therefore, the disk drive unit 18 can be easily inserted into the shelf 14 by pushing the second fit lever 70.

In the projected condition of the first and second fit levers 64 and 70, the pins 102 and 108 are positioned at the right ends of the elongated holes 40 and 52, respectively, as viewed in FIG. 6. In this condition, the distance between the upper fit plate 36 and the lower fit plate 44 is represented by w1. When the second fit lever 70 is further pushed from this condition, the pin 106 moves along the C-shaped slot 64 of the first fit lever 62, and in concert therewith, the first fit lever 62 is also pushed by the pin 106. Thus, the disk drive unit 18 is inserted into the shelf 14 in concert with the push operation of the first and second fit levers 62 and 70.

When the first and second fit levers 62 and 70 are fully pushed as shown in FIG. 7, the upper and lower fit plates 36 and 44 slide rightward as viewed in FIGS. 6 and 7 until the first and second fit levers 62 and 70 are received between the front plates 28 of the main frame 22, thus obtaining a retracted condition of the first and second fit levers 62 and 70. In this condition, the pins 102 and 108 are positioned at the left ends of the elongated holes 40 and 52, respectively, as viewed in FIG. 7. When the upper and lower fit plates 36 and 44 slide rightward as mentioned above, each ridge 37 of the upper fit plate 36 abuts against the corresponding ridge 34 of the upper wall 24 and climbs the slant surface of the ridge 34.

As a result, the upper fit plate 36 is raised (in a direction shown by arrow n1 in FIGS. 6, 7, 8A and 8B) to strongly abut against the shelf 14. Similarly, the lower fit plate 44 is lowered (in a direction shown by arrow n2 in FIGS. 6 and 7) to strongly abut against the shelf 14. In this condition where the upper and lower fit plates 34 and 44 strongly abut against the shelf 14, the distance between the upper and lower fit plates 36 and 44 is represented by w2 (>w1). Accordingly, the active disk drive unit 18 is firmly held in the shelf 14 without play, so that amplification of vibrations of the spindle motor or the like in the disk drive unit 18 can be eliminated to thereby effectively avoid the head off-track trouble.

In removing the active disk drive unit 18 from the shelf 14, the second fit lever 70 is strongly pulled out by inserting the operator's fingers into the semicircular recesses 56 of the front plates 28 of the main frame 22. As a result, the projection 80 of the block 78 and the projection 90 of the block 88 come into engagement with the shelf 14. Thereafter, by further pulling out the second fit lever 70, the active disk drive unit 18 can be easily released from the shelf 14 by the leverage. In this released condition, the first and second fit levers 62 and 70 become the projected condition as shown in FIG. 6, and the upper and lower fit plates 36 and 44 are moved leftward as shown in FIG. 6. As a result, each ridge 37 of the upper fit plate 36 is disengaged from the corresponding ridge 34 of the upper wall 24, and each ridge 48 of the lower fit plate 44 is also disengaged from the corresponding ridge of the lower wall 26, so that the upper and lower fit plates 36 and 44 are separated from the inner surface of the shelf 14.

Figure 9:
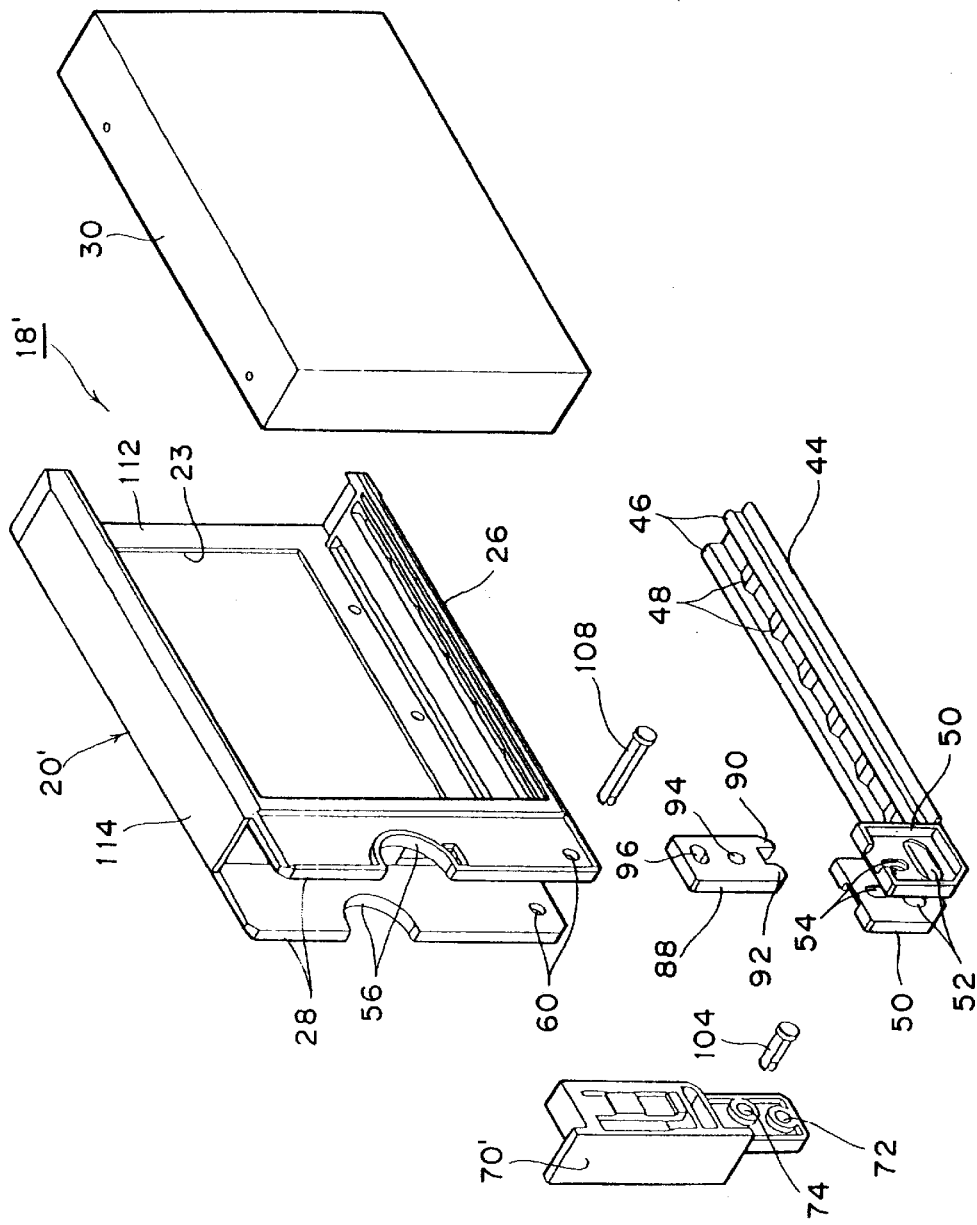
FIG. 9 is an exploded perspective view of a disk drive case according to a second preferred embodiment of the present invention.

Referring next to FIG. 9, there is shown an exploded perspective view of an active disk drive case 20' according to a second preferred embodiment of the present invention. The active disk drive unit 18' is composed generally of a case 20' and a hard disk drive (HDD) 30. The case 20' differs from the case 20 of the first preferred embodiment in the point that the upper fit plate 36, the block 78, and the first fit lever 62 of the case 20 are eliminated. Substantially the same parts as those in the first preferred embodiment are denoted by the same reference numerals in FIG. 9. The case 20' includes a main frame 112, a fit plate 44, a block 88, and a fit lever 70'. The main frame 112 includes an opening 23, an upper wall 114, a lower wall 26, and a pair of opposed front plates 28 connecting the upper wall 114 and the lower wall 26. Each front plate 28 has a substantially semicircular recess 56 and a hole 60. The fit plate 44 is slidably mounted on the lower wall 26. Alternatively, the fit plate 36 used in the first preferred embodiment may be slidably mounted on the upper wall 24 replaced by the upper wall 114. That is, in the second preferred embodiment, the fit plate 44 is formed with a pair of guide rails 46 and a plurality of ridges 48, and the lower wall 26 is formed with a pair of guide grooves for receiving the guide rails 46 of the fit plate 44 and a plurality of ridges arranged with the same pitch as that of the ridges 48 of the fit plate 44. The upper wall 114 has no such guide grooves and ridges as those of the lower wall 26.

The case 20' is assembled in the following manner. The fit plate 70' having two holes 72 and 74 and the block 88 having a hole 94 and an elongated hole 96 are inserted between a pair of opposed mounting portions 50 of the fit plate 44. Each mounting portion 50 has two elongated holes 52 and 54 perpendicular to each other. Then, a pin 104 is inserted through the elongated holes 54 of the mounting portions 50 of the fit plate 44, the hole 74 of the fit lever 70', and the elongated hole 96 of the block 88. In this condition, the fit lever 70' and the block 88 are pivotably mounted to the fit plate 44 by the pin 104. Then, the guide rails 46 of the fit plate 44 are inserted into the guide grooves of the lower wall 26 of the main frame 112, thereby slidably mounting the fit plate 44 to the lower wall 26 of the main frame 112. Then, a pin 108 is inserted through the holes 60 of the front plates 28 of the main frame 112, the elongated holes 52 of the mounting portions 50 of the fit plate 44, the hole 72 of the fit lever 70', and the hole 94 of the block 88, thus assembling the case 201. In this condition, the fit plate 44, the fit lever 70', and the block 88 are mounted to the main frame 112 by the pin 108 so that the fit plate 44 is slidable with respect to the main frame 112.

The operation of this preferred embodiment is substantially similar to that of the first preferred embodiment. When the fit lever 70' is projected from the main frame 112, each ridge 48 of the fit plate 44 is separated from and interposed between two adjacent ones of the ridges of the lower wall 26 of the main frame 112. In this condition, the active disk drive unit 18' is inserted into the shelf 14 by pushing the fit lever 70'. In this condition, the active disk drive unit 18' accommodating the HDD 30 in the case 20' is inserted into the shelf 14 by pushing the fit lever 70'.

When the fit lever 70' is pivotally moved to a retracted position where it is received between the front plates 28 of the main frame 112, the fit plate 44 slides relative to the lower wall 26, so that each ridge 48 of the fit plate 44 climbs the slant surface of the corresponding ridge of the lower wall 26. As a result, the distance between the upper wall 114 and the fit plate 44 is increased to thereby strongly hold the disk drive unit 18' within the shelf 14. Accordingly, amplification of vibrations of the spindle motor or the like can be eliminated to thereby effectively avoid the head off-track trouble.

Having thus described specific preferred embodiments of the present invention applied to a case for accommodating an active disk drive, the present invention is not limited to the above preferred embodiments, but may be applied to a case for accommodating general electronic equipment.

According to the present invention as described above in detail, the active disk drive unit as an example of electronic equipment can be firmly held in the shelf mounted in a computer, so that amplification of head vibrations due to vibrations of the spindle motor or the like can be eliminated to thereby effectively prevent the head off-track trouble.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A case for electronic equipment, comprising:

a main frame for accommodating said electronic equipment so that said electronic equipment is removably fitted within said main frame, said main frame including a first surface having a first pressure portion, a second surface having a second pressure portion, and a plate connecting said first surface and said second surface;

a first fit plate slidably mounted on said first surface, said first fit plate having a third pressure portion;

a second fit plate slidably mounted on said second surface, said second surface having a fourth pressure portion;

a first fit lever pivotably mounted to said plate so as to be operatively connected to said first fit plate; and a second fit lever having a first end portion pivotably mounted to said plate so as to be operatively connected to said second fit plate and a second end portion pivotably and slidably connected to said first fit lever;

said first and second fit levers being movable between a first position where said third and fourth pressure portions of said first and second fit plates are separated from said first and second pressure portions of said first and second surfaces, respectively, and a second position where said third and fourth pressure portions of said first and second fit plates are brought into pressure contact with said first and second pressure portions of said first and second surfaces, respectively, by sliding said first and second fit plates.

2. A case for electronic equipment according to claim 1, wherein:

said first fit lever has a substantially C-shaped slot;

said case further comprising a first pin slidably inserted through said slot of said first fit lever for pivotably and slidably mounting said second end portion of said second fit lever to said first fit lever.

3. A case for electronic equipment according to claim 2, wherein:

said first fit plate has a first elongated hole, and said second fit plate has a second elongated hole; and said first fit lever has a first hole, and said first end portion of said second fit lever has a second hole;

said case further comprising:

a second pin inserted through said first elongated hole and said first hole for operatively connecting said first fit plate to said first fit lever; and a third pin inserted through said second elongated hole and said second hole for operatively connecting said second fit plate to said second fit lever.

4. A case for electronic equipment, comprising:

a main frame for accommodating said electronic equipment so that said electronic equipment is removably fitted within said main frame, said main frame including a first surface, a second surface having a first pressure portion, and a plate connecting said first surface and said second surface;

a fit plate slidably mounted on said second surface, said fit plate having a second pressure portion and a third surface opposite said second pressure portion; and a fit lever pivotably mounted to said plate so as to be operatively connected to said fit plate;

said fit lever being movable between a first position where said second pressure portion of said fit plate is separated from said first pressure portion of said second surface and a second position where said second pressure portion of said fit plate is brought into pressure contact with said first pressure portion of said second surface by sliding said fit plate, wherein a distance between said first surface and said third surface in said second position is greater than a distance between said first surface and said third surface in said first position.

5. A case for electronic equipment, comprising:

a substantially U-shaped frame for removably accommodating said electronic equipment, said frame having a first outer wall and a second outer wall opposed to each other;

a first plate mounted on said first outer wall so as to be movable in a direction perpendicular to said first outer wall;

a second plate mounted on said second outer wall so as to be movable in a direction perpendicular to said second outer wall;

a first lever pivotably mounted to said frame so as to be operatively connected to said first plate; and a second lever having a first end portion pivotably mounted to said frame so as to be operatively connected to said second plate and a second end portion pivotably and slidably connected to said first lever;

said first and second levers being movable between a first position where a first distance is defined between said first and second plates and a second position where a second distance greater than said first distance is defined between said first and second plates by moving said first and second plates.

6. A case for electronic equipment, comprising:

a substantially U-shaped frame for removably accommodating said electronic equipment, said frame having a first outer wall and a second outer wall opposed to each other;

a plate mounted on said first outer wall so as to be movable in directions perpendicular to and parallel with said first outer wall, said plate and said second outer wall facing opposed faces of said first outer wall; and a lever pivotably mounted to said frame so as to be operatively connected to said plate;

said lever being movable between a first position where a first distance is defined between said plate and said second outer wall opposing to said first wall of said frame and a second position where a second distance greater than said first distance is defined between said plate and said second outer wall by moving said plate.

7. A case for electronic equipment, comprising:

a main frame for accommodating said electronic equipment so that said electronic equipment is removably fitted within said main frame, said main frame including a first surface, a second surface having a first pressure portion, and a plate connecting said first surface and said second surface;

a fit plate slidably mounted on said second surface, said fit plate having a second pressure portion; and a fit lever pivotably mounted to said plate so as to be operatively connected to said fit plate;

said fit lever being movable between a first position where said second pressure portion of said fit plate is separated from said first pressure portion of said second surface and a second position where said second pressure portion of said fit plate is brought into pressure contact with said first pressure portion of said second surface by sliding said fit plate, wherein said fit plate has an elongated hole, and said fit lever has a hole; and said case further comprises a pin inserted through said elongated hole of said fit plate and said hole of said fit lever for operatively connecting said fit plate to said fit lever.

* * * * *